United States Patent
Iwamura (10) Patent No.: US 6,562,445 B2
(45) Date of Patent: May 13, 2003

(54) DIAMOND-LIKE CARBON HARD MULTILAYER FILM AND COMPONENT EXCELLENT IN WEAR RESISTANCE AND SLIDING PERFORMANCE

(75) Inventor: Eiji Iwamura, Kobe (JP)

(73) Assignee: Kabushiki Kaisha Kobe Seiko Sho (Kobe Steel, Ltd.), Kobe (JP)

(*) Notice: Subject to any disclaimer, the term of this patent is extended or adjusted under 35 U.S.C. 154(b) by 11 days.

(21) Appl. No.: 09/813,219

(22) Filed: Mar. 21, 2001

(65) Prior Publication Data
US 2001/0031346 A1 Oct. 18, 2001

(30) Foreign Application Priority Data
Mar. 23, 2000 (JP) .......................... 2000-081969

(51) Int. Cl.[7] ............... B32B 9/00; B32B 7/02
(52) U.S. Cl. .............. 428/217; 428/212; 428/216; 428/336; 428/408
(58) Field of Search ............... 428/408, 212, 428/217, 216, 336

(56) References Cited
U.S. PATENT DOCUMENTS 5,114,696 A * 5/1992 Purdes
5,705,271 A * 1/1998 Okamura et al.
5,891,575 A * 4/1999 Marchywka et al.
576,683 A * 11/1999 Liehrr et al.
6,228,471 B1 * 11/1999 Neerinck et al.

* cited by examiner

Primary Examiner—Archene Turner
(74) Attorney, Agent, or Firm—Oblon, Spivak, McClelland, Maier & Neustadt, P.C.

(57) ABSTRACT

A coating film and a coated machine component that have an excellent wear resistance, a low friction coefficient, and an excellent sliding performance are provided. A coating film of the present invention is a DLC hard multilayer film 3 which has a low hardness hard carbon layer 4 containing a graphite cluster having a mean size of 2 nm or more, and a high hardness hard carbon layer 5 containing a graphite cluster having a mean size of 1 nm or less, the low hardness carbon layer 4 and the high hardness carbon layer 5 being amorphous structures each containing carbon as a main component, and being alternately laminated. The graphite cluster in the low hardness hard carbon layer 4 preferably has a shell structure in which the C-planes of graphite are laminated in the form of spherical nuclei. Further, it is preferable that the outermost layer A is formed of the low hardness hard carbon layer, and the layer thickness thereof is set at from 2 nm to 200 nm. Still further, a component of the present invention is formed by laminating the DLC hard multilayer film 3 on a substrate 1 with an intermediate layer 2 interposed therebetween.

13 Claims, 4 Drawing Sheets

DIAMOND-LIKE CARBON HARD MULTILAYER FILM AND COMPONENT EXCELLENT IN WEAR RESISTANCE AND SLIDING PERFORMANCE

BACKGROUND OF THE INVENTION

1. Field of the Invention

The present invention relates to protective films of: wear resistant components such as tools and dies; machine components and frictional components intended for industrial or home use represented by automobile parts; and magnetic heads of automatic readers for cards or tickets, printers. More particularly, it relates to a coating film and a coated machine component that have an excellent wear resistance and high frictional performance.

2. Description of Related Art

A hard carbon film is generally referred to as a diamond-like carbon (below, may be referred to as DLC) film. Although various designations such as hard non-crystal carbon, amorphous carbon, hard amorphous carbon, i-carbon, and diamond-like carbon are used for DLC, there is no definite distinction between these terms. The nature of the DLC having such various designations lies in being a mixture of diamond and graphite in terms of structure, i.e., having an intermediate structure therebetween. As with diamond, the DLC film is excellent in hardness, wear resistance, solid lubricity, thermal conductivity, chemical stability, and the like. Accordingly, it is being put to use as a coating film of each of various components such as sliding components, dies, cutting tools, wear-resistant machine parts, abrasive components, and magnetic and optical parts.

As the characteristics of the DLC film, mention may be made of the small friction coefficient (below, may be referred to as $\mu$) in contact with various counterpart materials including metals such as iron and aluminum, and ceramics such as glass. However, it has been known that the friction coefficient of the DLC film largely varies according to the measurement environment and counterpart materials. In general, for example, with iron-based counterpart materials, it is from 0.15 to 0.4 in an atmosphere, and it is 0.1 or less in a vacuum or in a dry nitrogen atmosphere.

A large number of studies have been done on the $\mu$ reducing mechanism of the DLC film. In general, it is considered that carbon atoms are attached to the counterpart material from the DLC film, so that the film is graphitized, and undergoes sliding deformation at the C-plane ($\pi$ bond plane) of the graphite to act as a self-lubricating material, resulting in a lower $\mu$.

When the DLC film is put to practical use as a hard coating film, it is essential that it has sufficient properties for friction coefficient as low as about 0.1 with respect to iron-based counterpart materials, thin-film hardness influencing the wear resistance, adhesion with the substrate affecting the reliability of the coating. A large number of proposals have been made concerning these conditions.

As particularly predominant means, mention may be made of addition of alloy elements to DLC, and attainment of laminated structure of the coating film. With the addition of alloy elements, it has been reported that, for example, when Si is added, $\mu$ is from 0.1 to 0.15, but the hardness is improved to about 30 GPa.

Laminated structure of DLC has been recognized as effective means for reduction of internal stress, improvement of adhesion, improvement of durability by an increase in film thickness, improvement of corrosion resistance, and control of electric resistance, and for example, the following technologies have been known:

(1) J-P-A No. 65625/1993 describes a laminated product which has a substrate, a hard carbon film, and a buffer layer made of one or more selected from silicon, germanium, silicon carbide, silicon nitride, silicon dioxide, glass, and alumina, the hard carbon film and the buffer layer being alternately laminated on the substrate, and the outermost layer being the hard carbon film.

(2) J-P-A No.237827/1998 describes a laminated product in which a hard carbon film, or a hard carbon film doped with at least one or more metallic elements, and at least one or more metals, metal carbide, metal nitride, or metal carbonitride are stacked repeatedly and alternately at a cycle of from 1 nm to 3 nm, or a laminated product in which at least two or more hard carbon films doped with different types of metallic elements or different amounts of the same metallic element are stacked repeatedly and alternately at a cycle of from 1 nm to 3 nm.

(3) J-P-A No. 226874/1998 describes a laminated product having carbon, or carbon and hydrogen, wherein the electric resistivity changes repeatedly at a repeating cycle of from 1 nm to 3 nm or discontinuously in the direction of thickness so that the maximum value differs from the minimum value by at least two digits.

(4) J-P-A No. 1013/1999 describes a thermal head having, as a protective film, a laminated film of a carbon layer containing carbon as a main component, and a metal layer containing, as a main component, an alloy of semimetals or metals having at least one or more, or at least two or more selected from the group consisting of Si, Ti, Zr, Hf, V, Nb, Ta, Cr, Mo, and W, wherein the film thickness of each layer is set to be from 0.5 nm to 50 nm, and the carbon layer/metal layer ratio is set at from 0.01 to 100.

(5) J-P-A No. 72288/1998 describes the following technique. A film-forming raw material gas containing a carbon compound gas is made into plasma through the application of voltage under vacuum conditions to produce a carbon film in which one or more than one carbon layer units each having a 10 nm to 200 nm-dia fine-grain thin-film carbon layer and a fine-grain carbon layer are formed. By the carbon film thus produced, stress is reduced, so that improvement of the adhesion, and improvement of the durability by an increase in film thickness are implemented.

(6) J-P-A No. 298097/1997 describes a laminated product having a DLC laminated film, wherein a conductive film, and a film having a higher hardness than that of the conductive film are alternately stacked into at least three or more layers so that the outermost layer is the conductive film.

The high frictional performance of a hard carbon film exemplified by DLC is considered to be attributable to the self lubricity resulting from sliding at the $\pi$ bond plane of the graphite crystal included therein, or formed at the sliding interface during sliding. Therefore, the graphite itself tends to be deformed, and hence for such a hard carbon film containing fine-grain graphite in itself, the friction coefficient is low and the frictional performance is good, while the film hardness itself is low, so that wear due to sliding is severe. Namely, if a low friction coefficient is sought, a high hardness cannot be obtained, or if the hardness is low even with a low friction coefficient, the wear resistance is insufficient. In either case, there occurs the problem that the film has insufficient durability as a hard coating film. In contrast, when the content of the graphite component in the DLC film is set to be low, the film hardness can be increased to ensure the wear resistance. However, reduction of the friction coefficient due to self lubricity of graphite is not attained sufficiently. Therefore, even among conventional DLCs of single-layer structure and multilayer structure, a DLC film achieving a friction coefficient as low as 0.15 or less, i.e., at least practically required value, and about 0.1 with stability, and having high wear resistance has not been implemented.

Further, for metal nitrides such as TiN, TiAlN, and CrN conventionally used as hard coating film materials, the friction coefficient is reduced by utilizing splashed particles referred to as macroparticles arising during film formation, and wear particles arising from attack on the counterpart material by the friction with the counterpart material, or attack by the counterpart material as lubricating materials. However, use of such a hard material inevitably entails troubles such as wear of a sliding component, an increase in friction coefficient with time, and clogging due to the wear particles.

SUMMARY OF THE INVENTION

The present invention has been achieved in view of the foregoing problems. It is therefore an object of the present invention to provide a coating film and a coated machine component that have an excellent wear resistance, a low friction coefficient, and an excellent sliding performance.

A coating film in accordance with a first aspect of the present invention is a DLC hard multilayer film, which has a low hardness hard carbon layer containing a graphite cluster having a mean size of 2 nm or more, and a high hardness hard carbon layer containing a graphite cluster having a mean size of 1 nm or less, the low hardness hard carbon layer and the high hardness hard carbon layer being amorphous structures each containing carbon as a main component, and being alternately laminated.

In accordance with a second aspect of the present invention, it is preferable that the graphite cluster in the low hardness hard carbon layer has a shell-like structure in which the C-planes (π bond planes) of graphite are laminated in the form of spherical nuclei. The form of spherical nuclei can also be expressed as the form of concentric spheres or the onion-like form. It can be supposed that the cluster having such a shell structure assumes a structure similar to that of a carbon onion such as $C_{1500}$ in which fullerene clusters form a nested structure. Further, in accordance with a third aspect of the present invention, it is preferable that the layer thickness of the low hardness hard carbon layer is from not less than 2 nm to not more than 30 nm, and the layer thickness of the high hardness hard carbon layer is from not less than 0.4 nm to not more than 10 nm. Still further, in accordance with a fourth aspect of the present invention, it is preferable that the ratio T1/T2 of the layer thickness T1 of the low hardness hard carbon layer to the layer thickness T2 of the high hardness hard carbon layer is from 5 to 0.2. Furthermore, in accordance with a fifth aspect of the present invention, it is preferable that the outermost layer is formed of the low hardness hard carbon layer, and the layer thickness thereof is from 2 nm to 200 nm. In this case, it is preferable that the thickness of the laminated portion inner than the outermost layer is set larger than the layer thickness of the outermost layer by at least 500 nm or more.

A component excellent in wear resistance and sliding performance in accordance with a seventh aspect of the present invention is formed by laminating the DLC multilayer film in accordance with any one of the first to sixth aspects on a substrate with an adhesion-improving intermediate layer interposed therebetween.

DETAILED DESCRIPTION OF THE PREFERRED EMBODIMENTS

The present inventors have focused attention on the fact that expression of the friction coefficient or the thin film hardness is largely affected by the microstructure of DLC, and they have studied the relationship between the microstructure and the frictional performance by functionally stacking DLC ultra-thin films each having different microstructures. As a result, they have found that, by controlling the form of the graphite cluster included in the DLC ultra-thin film, and further stacking two DLC films having different film qualities in appropriate film thicknesses and cycle, it is possible to obtain more excellent frictional performance, thus leading to the completion of the present invention.

Figure 1:
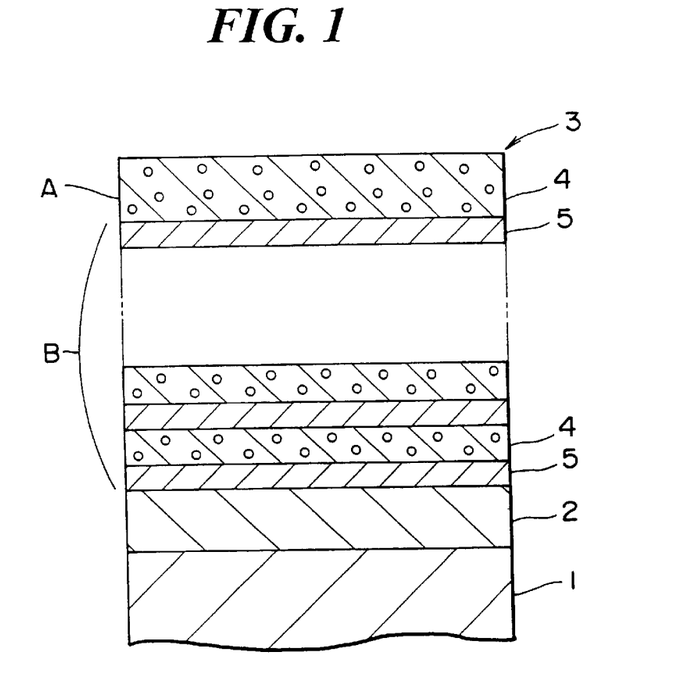
FIG. 1 is a schematic diagram showing the essential part in cross section of a component having a DLC hard multilayer film of the present invention.

Namely, as shown in FIG. 1, a DLC multilayer film of the present invention is a multilayer film 3 laminated on the surface of a substrate 1 with an intermediate layer 2 interposed therebetween. The multilayer film 3 is so configured that a high hardness hard carbon layer 5 containing a graphite cluster having a mean size of 1 nm or less and a low hardness hard carbon layer 4 containing a graphite cluster having a mean size of 2 nm or more are alternately laminated.

Examples of the substrate 1 usable include sintered hard alloys, iron-based alloys, titanium-based alloys, aluminum-based alloys, copper-based alloys, ceramics such as glass and alumina, Si, and resin materials.

The intermediate layer 2 has a function of ensuring the adhesion between the substrate 1 and the multilayer film 3. There can be used metals having such a function, and for example, the mixtures of metals and carbon described in J-P-A No. 29718/1998, or carbides of metals or semimetals, nitrides of metals or semimetals, or carbonitrides of metals or semimetals for substrate protection, or the like. It is noted that, the intermediate layer 2 is not limited to a monolayer, but it can also be formed in multilayer.

Each of the low hardness hard carbon layer 4 and the high hardness hard carbon layer 5 forming the multilayer film 3 is a thin-film amorphous structure in a broad sense containing carbon as a main component, i.e., the one having a texture not including a long-range regular periodic structure as with crystals. Microscopically, the low hardness hard carbon layer 4 contains graphite clusters having a mean size of 2 nm or more, while the high hardness hard carbon layer 5 contains graphite clusters having a mean size of 1 nm or less.

Figure 2:
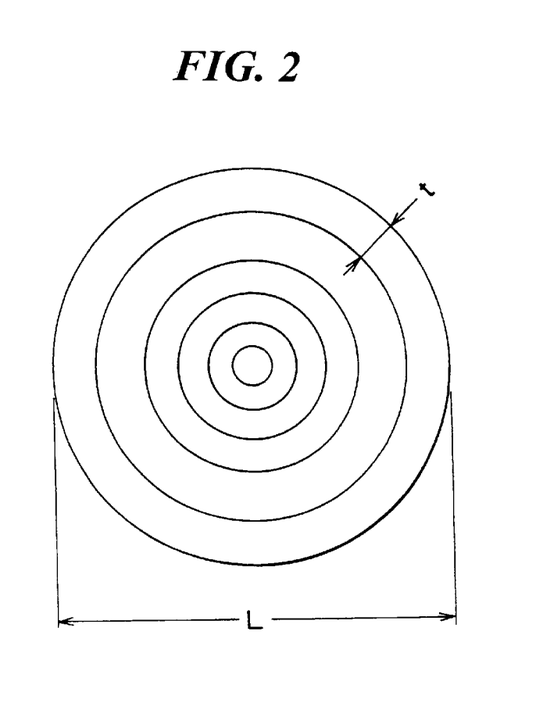
FIG. 2 is a transverse cross section showing the shell structure of a graphite cluster contained in a low hardness hard carbon layer.

Further, the graphite cluster in the low hardness hard carbon layer 4 desirably has a shell structure in which the C-planes (π bond planes) of the graphite are laminated in the form of spherical nuclei as shown in FIG. 2. The form of spherical nuclei can also be expressed as the form of concentric spheres, or the onion form. It can be supposed that the cluster having such a shell structure assumes the structure similar to that of carbon onion such as $C_{1500}$ in which fullerene clusters form a nested structre. The reference character "t" in the figure denotes the interplanar spacing between the C-planes, and it is about 0.335 nm. The reference character "L" denotes the cluster size. The low hardness hard carbon layer 4 contains large size graphite clusters having a mean size of 2 nm or more. Therefore, although it has a low hardness, carbon atom transfer to the counterpart material is promoted. Accordingly, the graphite clusters act as lubricating materials, resulting in a lower $\mu$ of the whole multilayer film. Particularly, by allowing the graphite cluster to assume a shell structure laminated in spherical nuclei form, the π bond plane of the cluster slides at the sliding surface, so that a reduction in friction coefficient can be achieved. A conventional graphite cluster has a large crystal anisotropy, and hence it tends to slide with respect to a stress parallel to the C-plane, but in contrast, it is less likely to slide with respect to a stress in a perpendicular direction. In this regard, by allowing each cluster to have a spherical nuclei form, and thus making it isotropic, each cluster causes sliding equally with respect to a stress in every direction, resulting in a low friction coefficient. In this case, the interplanar spacing of the C-planes is about 0.335 nm, so that at least two atom layers are required for causing sliding with stability. Further, in such a case that fullerene such as $C_{60}$ is present at the central portion of the sphere, its radius is about 0.7 nm, and hence the cluster size herein is supposedly 2 nm or more. In contrast, if the cluster size is smaller than 2 nm, it is considered that sliding is difficult to cause. On the other hand, in the high hardness hard carbon layer 5, by refining the graphite cluster down to a mean size of 1 nm or less, the possibility that sliding at the C-plane occurs is reduced. Accordingly, the film is made hard, thereby contributing to the improvement of the durability of the whole multilayer film.

Both of the size and form of the graphite cluster can be measured by observing the lattice image of the plane view or cross section of the layer using a high resolution transmission electron microscopy (TEM). Specifically, in TEM observation, by taking a photograph of the lattice image of a microstructure formed by the interference between a transmitted electron beam and a diffracted electron beam, it is possible to examine the graphite cluster. Namely, it is possible to evaluate the characteristics of the graphite cluster from the diameter of the graphite cluster occurred in the microstructure, and the form of the lattice image.

Most part of the low hardness hard carbon layer 4 and the high hardness hard carbon layer 5 is desirably formed of carbon as a main component in reducing the attacking property on the counterpart materials (ex., iron, aluminum, and titanium) for sliding. Namely, by forming both the low hardness layer and the high hardness layer with DLC hard carbon layers, the reactivity and the atomic interaction with the counterpart material for sliding are reduced. Accordingly, it is possible to reduce the friction coefficient, and reduce the wear of the counterpart material. The low hardness hard carbon layer 4 however may contain one or more of, for example, Si, Ti, W, Co, and the like in an amount of up to about 20%, having an effect of reducing the friction coefficient by the action of promoting the formation of a graphite cluster, preventing the moisture in an air from adhering thereto, or the like. Further, similarly, the low hardness hard carbon layer 4 or the high hardness hard carbon layer 5 may contain H and N in an amount of up to about 50%.

The layer thickness of the low hardness hard carbon layer 4 is preferably set at not less than 2 nm to not more than 30 nm. Whereas, the layer thickness of the high hardness hard carbon layer 5 is preferably set at not less than 0.4 nm to not more than 10 nm. Further, the layer thickness ratio T1/T2 is desirably set at from 5 to 0.2, where T1 denotes the layer thickness of the low hardness hard carbon layer 4, and T2 denotes the layer thickness of the high hardness hard carbon layer 5.

For the layer thickness of the low hardness hard carbon layer 4, if the layer thickness is less than 2 nm, formation of a graphite cluster with an appropriate size becomes difficult, so that the lower limit value is set at preferably 2 nm, and more preferably 4 nm. On the other hand, when wear due to sliding proceeds, a layer thickness of exceeding 30 nm increases the wear amount due to sliding of the layer 4 having a low hardness, causing a trouble. Therefore, the upper limit value is set at preferably 30 nm, and more preferably 15 nm.

For the layer thickness of the high hardness hard carbon layer 5, if the layer thickness is less than 0.2 nm, the wear resistance becomes difficult to maintain, so that the lower limit value is set at preferably 0.2 nm, and more preferably 0.4 nm. On the other hand, if the layer thickness is excessively increased to more than 10 nm, the friction at this layer affects the entire frictional performance at the portion exposed to the friction surface and the sliding surface. Further, the layer 5 having high hardness is enhanced in attacking property on the counterpart material, so that both are mutually ground by wear particles of the counterpart material or the layer 5 itself, causing an increase in friction coefficient or wear amount. Therefore, the upper limit value is set at preferably 10 nm and more preferably 5 nm.

For the layer thickness ratio T1/T2, it is considered that the rule of mixtures of mechanical properties holds when the low hardness hard carbon layer 4 and the high hardness hard carbon layer 5 assume a layered structure. Therefore, preferably, the layer 4 is not too thick, while the layer 5 is not too thin, and the layer thickness ratio T1/T2 is set so as to ensure a balance between the hardness and the friction coefficient of the whole multilayer film. If the T1/T2 exceeds 5, the low hardness hard carbon layer 4 becomes too thick as compared with the high hardness hard carbon layer 5, resulting in reductions of hardness and wear resistance. Accordingly, the function as the wear resistant layer is reduced. On the other hand, if the T1/T2 is less than 0.2, the high hardness hard carbon layer 5 becomes too thick, so that an edge of the high hardness hard carbon layer 5 occurs on the wear surface, resulting in an increase in $\mu$. Accordingly, the frictional performance is deteriorated. Therefore, the layer thickness ratio T1/T2 is set at preferably from 5 to 0.2, and more preferably from 3 to 0.5.

The length cycle in the direction of the layer thickness of a pair of hard carbon layers of the low hardness hard carbon layer 4 and the high hardness hard carbon layer 5 (referred to as laminating cycle) is desirably 10 nm or less. By setting the cycle at 10 nm or less, a layered structure of an ultra-thin DLC film can be obtained, so that the following effects can be exerted. That is, the occurrence of wear particles during sliding is reduced to inhibit the increase in friction coefficient resulting therefrom, and further the wear particles are made very fine, thereby reducing the wear of the counterpart material.

Further, preferably, the outermost layer A of the multilayer film 3 is composed of the low hardness hard carbon layer 4, and the thickness thereof is set at from 2 nm to 200 nm, and the thickness of the laminated portion B inner than the outermost layer A is set to be larger than that of the outermost layer A by at least 500 nm or more. It is noted that, when the outermost layer A is formed with a larger thickness than the layer thickness of the low hardness hard carbon layer 4 in the laminated portion B, the numerical values of the T1, T2, T1/T2, and laminating cycle denote respective recommendation values for the low hardness hard carbon layer 4 and the high hardness hard carbon layer 5 in the laminated portion B.

By constituting the outermost layer A with the low hardness hard carbon layer 4, attachment of carbon atoms to the counterpart material is promoted, and further, by self lubricating effect due to its own clusters, it is possible to reduce $\mu$ particularly in the initial stage of a sliding test, so that the initial wear can be inhibited. Further, by forming the laminated portion B with a thickness larger than that of the outermost layer A by 500 nm or more, it is possible to maintain excellent wear resistance and frictional performance under steady operating conditions.

Although the method for forming the multilayer film of the present invention has no particular restriction, the method in which formation is achieved using a solid carbon as an evaporation source (target) with sputtering is preferred because of its easy layer thickness control of angstrom order. More preferred is the method in which the substrate is further applied with a direct current or a high frequency bias voltage using an unbalanced magnetron sputtering method capable of allowing more ions to reach the substrate, thereby to control the graphite cluster size in the layer. It is considered that irradiation with electrons having energy is effective for forming the graphite cluster in a shell structure laminated in the form of spherical nuclei. It is also desirable from this viewpoint to use unbalanced magnetron sputtering capable of irradiating a thin film during film formation with electrons having a higher electron temperature by forming a high plasma density in the vicinity of the substrate without applying the substrate with a bias voltage.

The present invention will be described by way of the following examples, which should not be construed as limiting the scope of the invention.

EXAMPLES

Laminated component samples each having a coating film were manufactured by the following procedure. First, WC-Co system sintered hard alloy substrates 1 cm square, and about 5 mm in thickness were prepared for film hardness measurement, and SKH (high speed steel) substrates 50 mm in diameter and about 8 mm in thickness were prepared for friction coefficient measurement. Each of the substrates was degreased with acetone as the pretreatment for film formation, and was subjected to ultrasonic cleaning for 20 minutes. Thereafter, the substrate was sufficiently dried by injection of compressed air. The substrate subjected to such a treatment was set in a sputtering chamber, which was then evacuated to a vacuum of $3\times10^{-6}$ torr or less. Subsequently, an Ar gas was introduced into the chamber to a pressure of 3 mtorr, and a high frequency power source was applied to generate an Ar plasma, and sputter etching of the substrate surface by Ar ions was carried out at an rf power of 200 W for 5 minutes.

Then, a multilayer film or a monolayer film was coated on the surface of the substrate in the following manner. For the multilayer film, the outermost layer was formed of the low hardness hard carbon layer 4. Table 1 shows the layer thickness T1 of the low hardness hard carbon layer 4 constituting the laminated portion except for the outermost layer, the layer thickness T2 of the high hardness hard carbon layer 5, the layer thickness ratio T1/T2, the number of stacked layers, and the layer thickness of the outermost layer. In Table 1, the laminating cycle of the layer 4 and the layer 5 is also shown.

(1) Samples Nos. 1 to 14, and 19 (Examples), Samples Nos. 26 to 32 (Comparative Examples)

On each of the substrates, first, a W metal layer was formed with a thickness of about 50 nm as a first intermediate layer, and then a W—carbon mixed amorphous layer was formed with a thickness of about 200 nm as a second intermediate layer by rotational film formation. Further, the low hardness hard carbon layer 4 and the high hardness hard carbon layer 5 were alternately formed thereon.

(2) Samples Nos. 15 to 17 (Examples)

Multilayer films were formed in the same manner as in the procedure (1), except that there were adopted the compositions of respective low hardness hard carbon layers 4, including, other than C, 10 mass % W for the sample No. 15, 10 mass % Si for the sample No. 16, and 30 mass % N for the sample No. 17.

(3) Sample No. 18 (Example)

On the substrate, first, a TiAlN layer was formed with a thickness of 1 $\mu$m as an underlying intermediate layer by means of an arc ion plating film forming apparatus. Then, a Ti metal layer of the first intermediate layer was formed with a thickness of about 50 nm thereon by a sputtering method, and a Ti—carbon mixed amorphous layer of the second intermediate layer was formed with a thickness of about 200 nm thereon by rotational film formation. Further, the low hardness hard carbon layer 4 and the high hardness hard carbon layer 5 were alternately formed thereon.

(4) Samples Nos. 21 and 22 (Comparative Examples)

In the same manner as in the procedure (1), on each substrate, the first and second intermediate layers were formed, and a monolayer (layer thickness: 1 $\mu$m) low hardness hard carbon layer (for No. 21) or high hardness hard carbon layer (for No. 22) was formed thereon.

(5) Samples Nos. 23 to 25 (Comparative Examples)

On each substrate, a TiAlN monolayer film (layer thickness: 1 $\mu$m) was formed for No. 23, a CrN monolayer film (layer thickness: 1 $\mu$m) for No. 23, and a TiN monolayer film (layer thickness: 1 $\mu$m) for No. 25 by means of an arc ion plating film forming apparatus.

It is noted that, each of the comparative samples Nos. 26 to 30 denotes the case where T1 or T2 is beyond the scope of the present invention, each of the comparative samples 31 and 31 denotes the case where T1/T2 is beyond the scope of the present invention, and the comparative sample No. 32 denotes the case where the layer thickness of the outermost layer is beyond the scope of the present invention.

The intermediate layers and the hard carbon layers were all formed by means of a dc magnetron sputtering by the HSM-752 sputtering system manufactured by Shimadzu Corporation. The common film formation conditions were as follows. That is, the distance between the target and the substrate was 55 mm, the substrate temperature was room temperature, a conventional cathode structure (below, abbreviated as CM) was used with respect to a metal target, and a UBM cathode structure was used with respect to a carbon target for film formation. The film forming power was 500

W for the first intermediate layer. For the second intermediate layer, the power was smoothly decreased from 500 W down to 0 W with respect to a metal target. Further, the power was smoothly increased from 0 W up to 1 kW for a carbon target, so that a gradient layer in which the composition continuously changed was provided. Formation of the low hardness hard carbon layer 4 (including the outermost layer) was accomplished without applying the substrate with a bias voltage. On the other hand, formation of the high hardness hard carbon layer 5 was accomplished through application with a prescribed dc substrate bias voltage.

Further, each of the samples obtained was evaluated for its film hardness, friction coefficient, and attacking property on the counterpart material by the following respective methods. The results are shown in Table 2.

(1) Film Hardness

Measurement was carried out by means of the Nano Indentation Tester ENT-1100 manufactured by Elionix Inc. For measurement, each sample was fixed on a measurement holder by an adhesive, mounted in a heating stage, and then, it was isothermally held at 26° C. for 12 hours or more. When a temperature difference between the apparatus and

TABLE 1

| Sample No. | Film structure | Laminating cycle (nm) | Low hardness hard carbon layer Layer thickness T1 (nm) | High hardness hard carbon layer Layer thickness T2 (nm) | Layer thickness ratio T1/T2 | Number of stacked layers | Outermost layer layer thickness (nm) |
|---|---|---|---|---|---|---|---|
| 1 | Multilayer | 10.0 | 6.7 | 3.3 | 2.0 | 80 | 50 |
| 2 | Multilayer | 10.0 | 5.0 | 5.0 | 1.0 | 80 | 50 |
| 3 | Multilayer | 10.0 | 4.0 | 6.0 | 0.67 | 80 | 50 |
| 4 | Multilayer | 10.0 | 3.3 | 6.7 | 0.5 | 80 | 50 |
| 5 | Multilayer | 12.0 | 10.0 | 2.0 | 5.0 | 100 | 50 |
| 6 | Multilayer | 12.0 | 2.0 | 10.0 | 0.2 | 100 | 50 |
| 7 | Multilayer | 2.4 | 2.0 | 0.4 | 5.0 | 500 | 50 |
| 8 | Multilayer | 2.5 | 2.0 | 0.5 | 4.0 | 480 | 50 |
| 9 | Multilayer | 3.0 | 2.0 | 1.0 | 2.0 | 400 | 50 |
| 10 | Multilayer | 6.0 | 3.0 | 3.0 | 1.0 | 200 | 50 |
| 11 | Multilayer | 20.0 | 15.0 | 5.0 | 3.0 | 50 | 50 |
| 12 | Multilayer | 30.0 | 20.0 | 10.0 | 2.0 | 40 | 50 |
| 13 | Multilayer | 40.0 | 30.0 | 10.0 | 3.0 | 30 | 50 |
| 14 | Multilayer | 10.0 | 5.0 | 5.0 | 1.0 | 80 | 200 |
| 15 | Multilayer | 10.0 | 5.0 | 5.0 | 1.0 | 80 | 50 |
| 16 | Multilayer | 10.0 | 5.0 | 5.0 | 1.0 | 80 | 50 |
| 17 | Multilayer | 10.0 | 5.0 | 5.0 | 1.0 | 80 | 50 |
| 18 | Multilayer | 10.0 | 5.0 | 5.0 | 1.0 | 50 | 50 |
| 19 | Multilayer | 10.0 | 6.7 | 3.3 | 2.0 | 80 | 2 |
| *21 | DLC monolayer | — | — | — | — | — | — |
| *22 | DLC monolayer | — | — | — | — | — | — |
| *23 | TiAlN monolayer | — | — | — | — | — | — |
| *24 | CrN monolayer | — | — | — | — | — | — |
| *25 | TiN monolayer | — | — | — | — | — | — |
| *26 | Multilayer | 2.0 | 1.0 | 1.0 | 1.0 | 500 | 50 |
| *27 | Multilayer | 60.0 | 50.0 | 10.0 | 5.0 | 20 | 50 |
| *28 | Multilayer | 0.6 | 0.3 | 0.3 | 1.0 | 2000 | 50 |
| *29 | Multilayer | 40.0 | 20.0 | 20.0 | 1.0 | 30 | 50 |
| *30 | Multilayer | 11.0 | 1.0 | 10.0 | 0.1 | 100 | 50 |
| *31 | Multilayer | 22.0 | 20.0 | 2.0 | 10.0 | 50 | 50 |
| *32 | Multilayer | 10.0 | 5.0 | 5.0 | 1.0 | 80 | 250 |

(Note)
*Comparative Example

Figure 3:
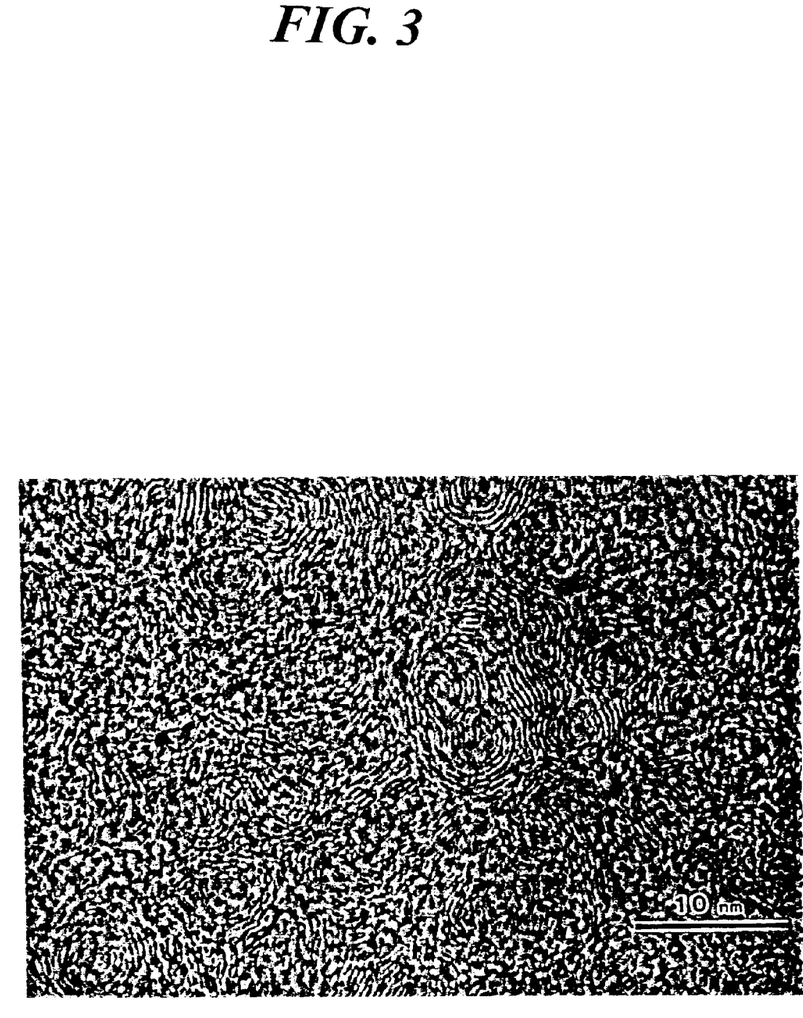
FIG. 3 is a substitute photograph for a drawing of a lattice image example by plane-view TEM observation of the low hardness hard carbon layer.
Figure 4:
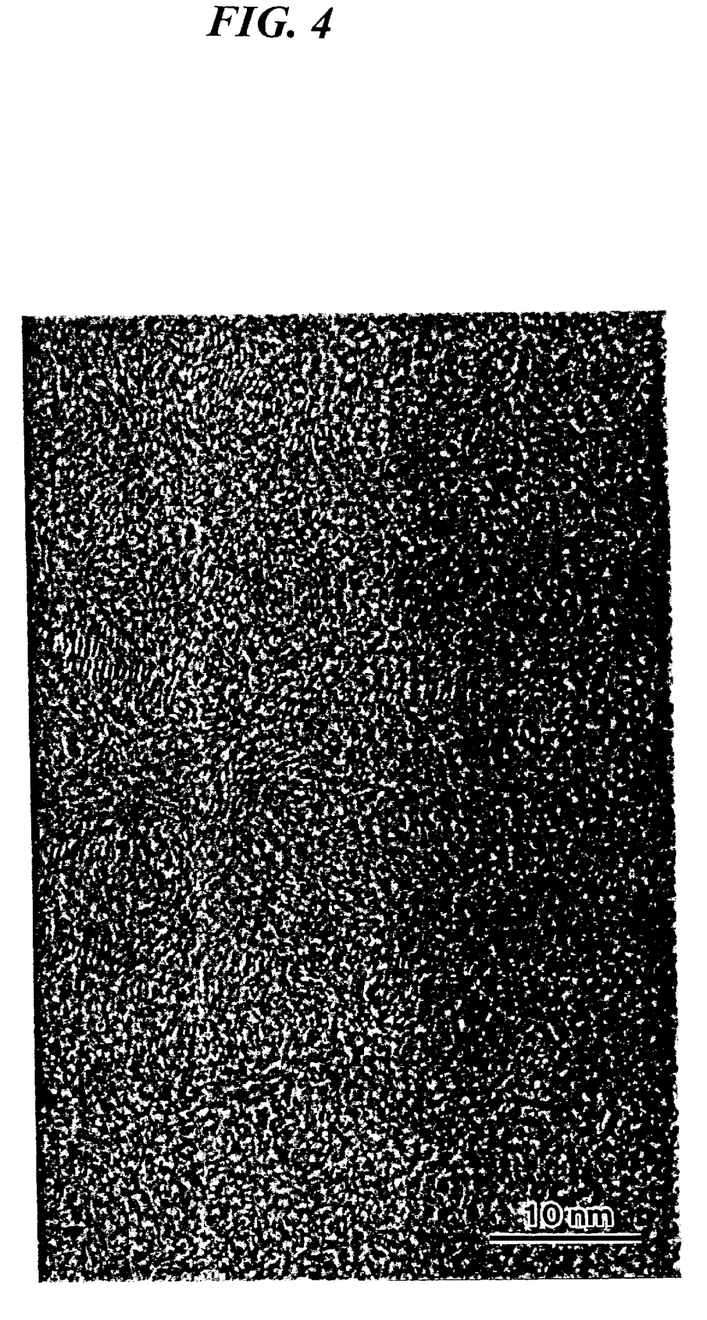
FIG. 4 is a substitute photograph for a drawing of a lattice image example by cross-section TEM observation of the low hardness hard carbon layer.
Figure 5:
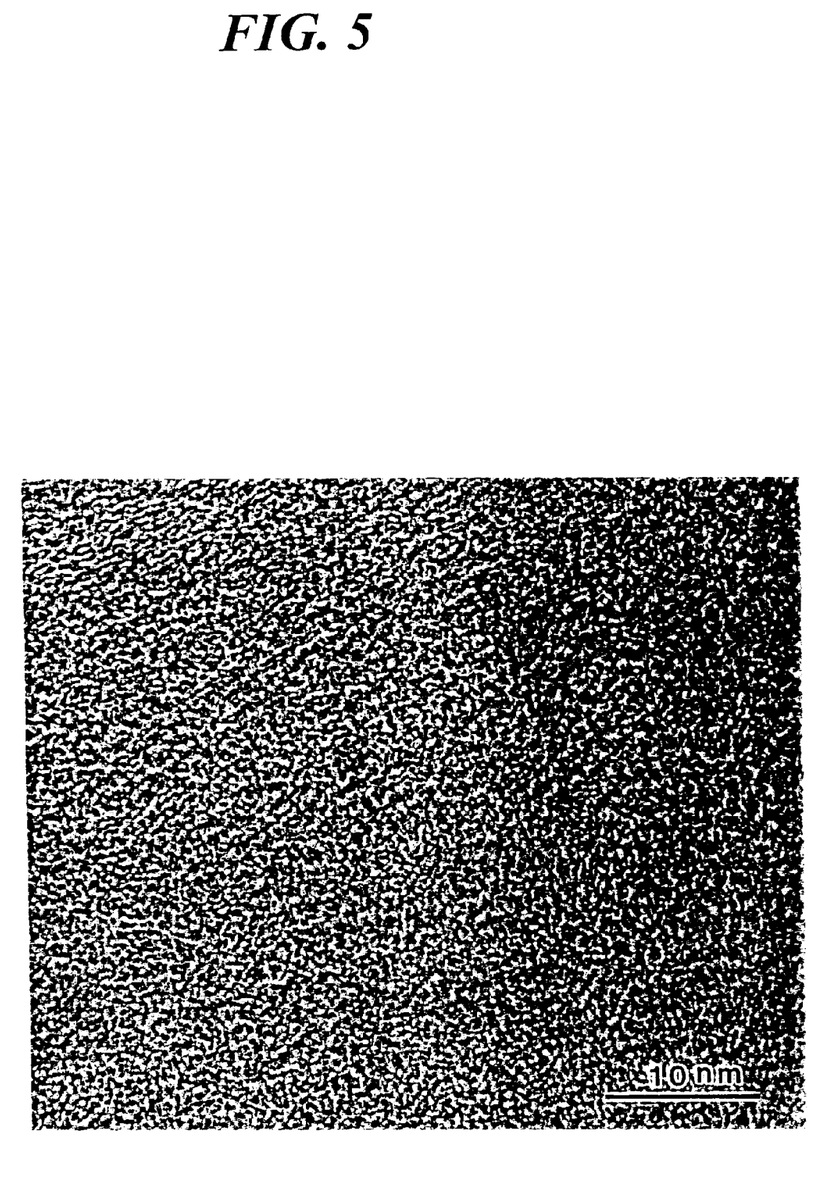
FIG. 5 is a substitute photograph for a drawing of a lattice image example by plane-view TEM observation of a high hardness hard carbon layer

The textures of the low hardness hard carbon layer and the high hardness hard carbon layer of each multilayer film was subjected to TEM observation for the samples thus manufactured. As a result, graphite clusters each having a shell structure in spherical nucleus form was observed in the low hardness hard carbon layer with a layer thickness of 2 nm or more, whereas, no graphite cluster with a shell structure was observed in the low hardness hard carbon layer with a layer thickness of 1 nm and the high hardness hard carbon layer. As the TEM observation examples, the lattice images obtained by TEM observations for the layer plane view and the layer cross section of the low hardness hard carbon layer of the sample No. 21 are shown in FIGS. 3 and 4, respectively. The lattice images observed from either directions are in spiral forms, indicating that the graphite cluster forms the shell structure as shown in FIG. 2. On the other hand, FIG. 5 shows the TEM observation lattice image in the layer plane view of the high hardness hard carbon layer of the same sample. FIG. 5 indicates that no clear lattice image is observed, and graphite clusters become very fine grains of at least 1 nm or less.

the sample disappeared, the hardness was determined under a load of 500 mg.

(2) Friction coefficient

The HEIDON reciprocating sliding tester was used. At this step, the sample was fixed on a stage, and a sliding test was carried out by using an about 8 mm dia steel ball manufactured by SUJ2, under a load of 4.9 N applied on the sample surface, at a sliding speed of 20 mm/sec, and with a sliding width of 10 mm. Thus, the mean coefficients of friction for total sliding distances of from 0 to 5 m, from 50 to 150 m, and from 150 m to 200 m, and the friction coefficient when the total sliding distance had reached 1 km were determined. The test environment was in an atmosphere, and it was controlled such that the atmospheric temperature was from 20 to 26° C., and the humidity was from 40 to 80%.

(3) Counterpart material attacking property

Evaluation was carried out by determining the area of the wear surface of the steel ball manufactured by SUJ2, i.e., the counterpart material when the sliding distance had reached 200 m by the HEIDON reciprocating sliding tester.

TABLE 2

| Sample No. | Film hardness (GPa) | Friction coefficient | | | | Wear amount of SUJ2 (mm²) |
|---|---|---|---|---|---|---|
| | | 0–5 m | 50–150 m | 150–200 m | 1 km | |
| 1 | 38 | 0.16 | 0.12 | 0.11 | 0.12 | 0.01 |
| 2 | 52 | 0.17 | 0.10 | 0.11 | 0.11 | 0.01 |
| 3 | 56 | 0.19 | 0.13 | 0.12 | 0.12 | 0.01 |
| 4 | 59 | 0.18 | 0.13 | 0.13 | 0.12 | 0.02 |
| 5 | 33 | 0.15 | 0.15 | 0.14 | 0.15 | 0.02 |
| 6 | 67 | 0.18 | 0.15 | 0.15 | 0.15 | 0.01 |
| 7 | 36 | 0.17 | 0.15 | 0.14 | 0.13 | 0.02 |
| 8 | 36 | 0.17 | 0.14 | 0.14 | 0.14 | 0.01 |
| 9 | 43 | 0.16 | 0.14 | 0.13 | 0.13 | 0.02 |
| 10 | 55 | 0.16 | 0.12 | 0.11 | 0.13 | 0.02 |
| 11 | 35 | 0.17 | 0.11 | 0.13 | 0.12 | 0.01 |
| 12 | 38 | 0.16 | 0.13 | 0.14 | 0.13 | 0.03 |
| 13 | 32 | 0.16 | 0.13 | 0.15 | 0.15 | 0.06 |
| 14 | 46 | 0.15 | 0.12 | 0.09 | 0.12 | 0.03 |
| 15 | 39 | 0.18 | 0.15 | 0.15 | 0.15 | 0.13 |
| 16 | 41 | 0.18 | 0.10 | 0.09 | 0.12 | 0.07 |
| 17 | 65 | 0.17 | 0.10 | 0.10 | 0.11 | 0.05 |
| 18 | 41 | 0.16 | 0.12 | 0.11 | 0.11 | 0.02 |
| 19 | 39 | 0.19 | 0.14 | 0.11 | 0.13 | 0.01 |
| *21 | 82 | 0.23 | 0.21 | 0.22 | 0.20 | 0.05 |
| *22 | 21 | 0.19 | 0.24 | 0.31 | >1.00 | 0.07 |
| *23 | 55 | 0.57 | 0.45 | 0.42 | 0.40 | 3.95 |
| *24 | 45 | 0.65 | 0.67 | 0.67 | 0.67 | 1.81 |
| *25 | 47 | 0.62 | 0.59 | 0.56 | 0.53 | 2.78 |
| *26 | 56 | 0.18 | 0.23 | 0.24 | 0.30 | 0.01 |
| *27 | 29 | 0.17 | 0.16 | 0.25 | 0.34 | 0.03 |
| *28 | 55 | 0.16 | 0.22 | 0.25 | 0.20 | 0.01 |
| *29 | 45 | 0.18 | 0.21 | 0.25 | 0.32 | 0.03 |
| *30 | 80 | 0.18 | 0.22 | 0.21 | 0.23 | 0.04 |
| *31 | 22 | 0.18 | 0.22 | 0.30 | 0.40 | 0.04 |
| *32 | 47 | 0.18 | 0.22 | 0.28 | 0.24 | 0.02 |

(Note)
*Comparative Example

Apparent from Table 2, with the DLC hard multilayer film of each example, the friction coefficient in the early stage of sliding is a little higher, but in the subsequent stage, a friction coefficient of 0.15 or less can be obtained with stability, the hardness is 35 GPa or more, and hence the durability is high, and the attacking property on the counterpart material is very small. On the other hand, for the DLC monolayer film (No. 21 or 22) not using a DLC multilayer film, there occur the following problems. Namely, the friction coefficient in the early stage of sliding exceeds 0.2, and the friction coefficient increases with an increase in sliding distance. Further, the film hardness is too low, thereby entailing a problem associated with the durability. For each of the metal nitride films of Nos. 23 to 25, the friction coefficient and the attacking property on the counterpart material are both very high. Further, even for the DLC multilayer film, if the layer thickness and the layer thickness ratio of each hard carbon layer, and the layer thickness of the outermost layer are beyond the scope of the present invention as with Nos. 26 to 32, a good friction coefficient of 0.15 or less cannot be obtained with stability, so that the frictional performance is deteriorated.

The DLC hard multilayer film of the present invention has high hardness and a low friction coefficient, and hence it is excellent not only in wear resistance but also in frictional performance. Further, since it has a low attacking property on the counterpart material, it can be suitably utilized for, for example, coating films of various sliding components, particularly automobile parts, tools, machine parts, and the like, and protective films of magnetic heads of automatic readers of cards or tickets, printers, and the like. Further, since a component having the DLC hard multilayer film of the present invention is excellent in wear resistance and frictional performance, it can be suitably used for the foregoing various uses.

What is claimed is:

1. A diamond-like carbon multilayer film, comprising a low hardness diamond-like carbon layer containing a graphite cluster having a mean size of 2 nm or more, and a high hardness diamond-like carbon layer containing a graphite cluster having a mean size of 1 nm or less, the low hardness diamond-like carbon layer and the high hardness diamond-like carbon layer being amorphous structures each containing carbon as a main component, and being alternately laminated, wherein the layer thickness of the low hardness diamond-like carbon layer is from not less than 2 nm to not more than 30 nm, and the layer thickness of the high hardness diamond-like carbon layer is from not less than 0.4 nm to not more than 10 nm.

2. The diamond-like carbon multilayer film according to claim 1, wherein the graphite cluster in the low hardness diamond-like carbon layer has a shell structure in which the C-planes of graphite are laminated in the form of spherical nuclei.

3. The diamond-like carbon multilayer film according to claim 2, wherein the interplanar spacing of the C-planes is about 0.335 nm.

4. The diamond-like carbon multilayer film according to claim 1, wherein the ratio T1/T2 of the layer thickness T1 of the low hardness diamond-like carbon layer to the layer thickness T2 of the high hardness diamond-like carbon layer is from 5 to 0.2.

5. The diamond-like carbon multilayer film according to claim 1, wherein the outermost layer is formed of the low hardness diamond-like carbon layer, and the layer thickness thereof is from 2 nm to 200 nm.

6. The diamond-like carbon multilayer film according to claim 5, wherein the laminated portion under the outermost layer has a thickness larger than the layer thickness of the outermost layer by at least 500 nm or more.

7. A component comprising a substrate, an adhesion-improving intermediate layer on the substrate, and the diamond-like carbon multilayer film according to any one of claims 1 to 6 formed on the substrate with the intermediate layer interposed therebetween.

8. The component according to claim 7, wherein said substrate is selected from the group consisting of sintered alloys, iron-based alloys, titanium-based alloys, aluminum-based alloys, copper-based alloys, ceramics, alumina, silicon and resins.

9. The diamond-like carbon multilayer film according to claim 1, wherein the graphite cluster in the low hardness diamond-like carbon layer has a shell structure in which the it bond planes are laminated in the form of concentric spheres.

10. The diamond-like carbon multi-layer film according to claim 1, wherein the low hardness diamond-like carbon layer comprises one or more of Si, Ti, W, Co, H or N.

11. The diamond-like carbon multilayer film according to claim 1, wherein the high hardness diamond-like carbon layer comprises one or more of H or N.

12. The diamond-like carbon multilayer film according to claim 1, wherein the layer thickness of the low hardness diamond-like carbon layer is from not less than 4 nm to not more than 15 nm, and the layer thickness of the high hardness diamond-like carbon layer is from not less than 0.4 nm to not more than 5 nm.

13. The diamond-like carbon multilayer film according to claim 1, wherein the ratio T1/T2 of the layer thickness T1 of the low hardness diamond-like carbon layer to the layer thickness T2 of the high hardness diamond-like carbon layer is from 3 to 0.5.

* * * * *